(12) United States Patent
Hsiao et al.

(10) Patent No.: US 12,062,543 B2
(45) Date of Patent: Aug. 13, 2024

(54) LINE-END EXTENSION METHOD AND DEVICE

(71) Applicant: Taiwan Semiconductor Manufacturing Co., Ltd., Hsinchu (TW)

(72) Inventors: Chih-Min Hsiao, Hsinchu (TW); Chien-Wen Lai, Hsinchu (TW); Ru-Gun Liu, Hsinchu (TW); Chih-Ming Lai, Hsinchu (TW); Shih-Ming Chang, Hsinchu (TW); Yung-Sung Yen, Hsinchu (TW); Yu-Chen Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 5 days.

(21) Appl. No.: 17/869,707

(22) Filed: Jul. 20, 2022

(65) Prior Publication Data
US 2022/0359203 A1 Nov. 10, 2022

Related U.S. Application Data

(62) Division of application No. 16/806,206, filed on Mar. 2, 2020, now Pat. No. 11,854,807.

(51) Int. Cl.
*H01L 21/033* (2006.01)
*H01L 21/265* (2006.01)
*H01L 21/311* (2006.01)
*H01L 21/3115* (2006.01)

(52) U.S. Cl.
CPC ...... *H01L 21/0338* (2013.01); *H01L 21/0335* (2013.01); *H01L 21/0337* (2013.01); *H01L 21/26586* (2013.01); *H01L 21/31116* (2013.01); *H01L 21/31144* (2013.01); *H01L 21/31155* (2013.01)

(58) Field of Classification Search
None
See application file for complete search history.

(56) References Cited

U.S. PATENT DOCUMENTS

| | | | |
|---|---|---|---|
| 7,553,771 B2 | 6/2009 | Kim et al. | |
| 10,504,840 B2 | 12/2019 | Xu | |
| 10,707,080 B2 | 7/2020 | Chou | |
| 2018/0130668 A1 | 5/2018 | Liu et al. | |
| 2019/0027365 A1 | 1/2019 | Chou | |
| 2019/0139823 A1* | 5/2019 | Chen | H01L 23/5226 |
| 2019/0206728 A1* | 7/2019 | Wallace | H01L 21/76808 |
| 2020/0357640 A1* | 11/2020 | Prasad | H01L 21/02274 |

FOREIGN PATENT DOCUMENTS

| | | |
|---|---|---|
| DE | 102018122496 A1 | 4/2019 |
| JP | 2000208611 A | 7/2000 |
| KR | 970023809 A | 5/1997 |
| KR | 20080100691 A | 11/2008 |

* cited by examiner

*Primary Examiner* — Nilufa Rahim
(74) *Attorney, Agent, or Firm* — Seed IP Law Group LLP

(57) ABSTRACT

Methods of forming line-end extensions and devices having line-end extensions are provided. In some embodiments, a method includes forming a patterned photoresist on a first region of a hard mask layer. A line-end extension region is formed in the hard mask layer. The line-end extension region extends laterally outward from an end of the first region of the hard mask layer. The line-end extension region may be formed by changing a physical property of the hard mask layer at the line-end extension region.

20 Claims, 10 Drawing Sheets

LINE-END EXTENSION METHOD AND DEVICE

PRIORITY CLAIM AND CROSS-REFERENCE

This application is a divisional of Ser. No. 16/806,206 filed Mar. 2, 2020, which is incorporated by reference herein.

BACKGROUND

Advances in the manufacture of semiconductor integrated circuits (ICs) have led to increases in functional density (i.e., the number of interconnected devices per chip area) as well as decreases in geometry size (i.e., the smallest component (or line) that can be created using a fabrication process). Increasing functional density while decreasing geometry size generally provides benefits by increasing production efficiency and lowering associated costs. However, such advances in terms of size and density of devices or components has also been accompanied by increased complexity in design and manufacturing of devices incorporating these ICs.

For example, reducing sizes and spacing between ICs features defined and formed on a semiconductor substrate generally includes using a plurality of different photolithographic masks, and cut processes are performed to yield patterned features utilized in the IC.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
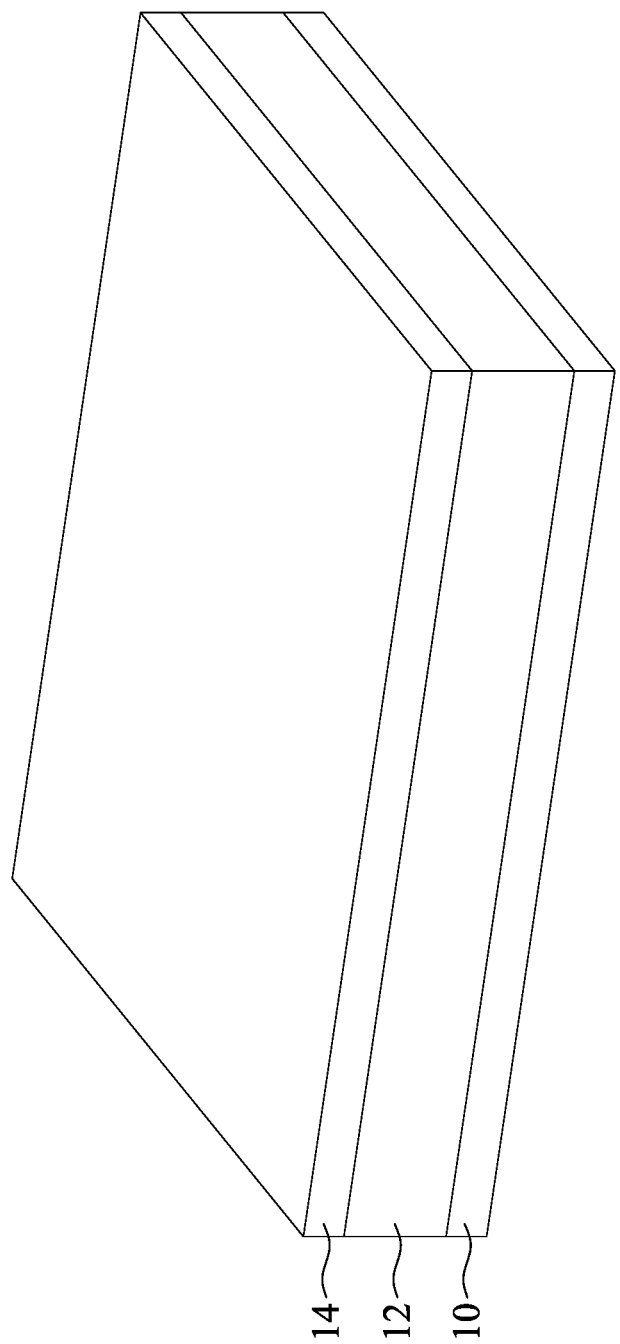
FIGS. 1 through 8 are cross-sectional views illustrating a method of fabricating an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to deposition techniques for depositing dielectric layers, metals, or any other materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described.

Reference throughout the specification to etching techniques for selective removal of semiconductor materials, dielectric materials, metals, or any other materials includes such processes as dry etching, wet chemical etching, reactive ion (plasma) etching (ME), washing, wet cleaning, pre-cleaning, spray cleaning, chemical-mechanical planarization (CMP) and the like. Specific embodiments are described herein with reference to examples of such processes. However, the present disclosure and the reference to certain etching techniques should not be limited to those described.

As the sizes or dimensions of features formed in integrated circuits decrease, a spacing, distance, or gap between ends of adjacent features may be constrained by limits of the processing steps utilized to form the features. For example, photolithographic and cutting processes used to manufacture patterned features of an integrated circuit may have lower limits in terms of spacing between features that can practically be achieved. These lower limits may be defined, for example, by dimensions of a photomask that can be physically produced based on the layout for the integrated circuit.

As described herein, the present disclosure provides methods and devices in which line-end extensions of patterned features are formed at the end of feature lines, thereby facilitating a reduction in the distance or gap that may be achieved between patterned features of an integrated circuit. In some embodiments, the line-end extensions may be formed without additional cut layers (and corresponding additional mask processes), which otherwise may be relied on to form line-end extensions in other techniques.

In view of the foregoing, various embodiments of the present application are directed towards methods and devices in which line-end extension regions are formed in a hard mask layer by directed bombardment of ion beams. The ion beams may be at least partially blocked from reaching line-end extension regions of the hard mask layer. The line-end extension regions may be regions which extend laterally outward from ends of a patterned photoresist on the hard mask layer, and the patterned photoresist blocks at least some of the ion beams from reaching the line-end extension regions. For example, the line-end extension regions may be shadow regions which receive a lower concentration or less of the ions than other regions of the hard mask layer. The ions may change a physical property of the hard mask layer, such as a selectivity to an etchant. As such, the unblocked regions of the hard mask layer may be readily removed by an etchant, while the line-end extension regions (as well as regions which were covered by the patterned photoresist) of the hard mask layer may be retained and used to pattern a target layer. Patterned features may thus be formed in a self-aligned manner in which the patterned features include regions corresponding to the line-end extension regions of the hard mask layer. This facilitates a significant reduction in a gap between patterned features that may be achieved.

FIGS. 1 through 8 are cross-sectional views illustrating a method of fabricating an integrated circuit in accordance with one or more embodiments of the present disclosure. Additional steps can be provided before, during, and after the method, and some of the steps described can be replaced or eliminated for other embodiments of the method.

As shown in FIG. 1, a hard mask 14 is formed on a target layer 12. The hard mask 14 may be any suitable hard mask including a masking material used to protect underlying regions (e.g., of the target layer 12) during processing. Suitable materials for the hard mask 14 may include dielectric materials (e.g., semiconductor oxides, semiconductor nitrides, semiconductor oxynitrides, semiconductor carbides, metal oxides, other metal compounds, etc.), metals, metal alloys, polysilicon, and/or other suitable materials. In some embodiments, the hard mask 14 is a silicon nitride film.

The hard mask 14 may be formed by any suitable process, including, for example, deposition, anodization, thermal oxidation, or the like. In some embodiments, the hard mask 14 is formed by a deposition process. The deposition process may be any suitable deposition process for depositing a hard mask layer, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like.

The target layer 12 is formed on a substrate 10. The substrate 10 may be any suitable substrate, such as any suitable semiconductor substrate. In various embodiments, the substrate 10 may be formed of a crystalline semiconductor material, for example, monocrystalline silicon, polycrystalline silicon, or some other type of crystalline semiconductor material. In some embodiments, the substrate 10 is a silicon substrate; however, embodiments provided herein are not limited thereto. For example, in various embodiments, the substrate 10 may include gallium arsenide (GaAs), gallium nitride (GaN), silicon carbide (SiC), or any other semiconductor material. The substrate 10 may include various doping configurations depending on design specifications. In some embodiments, the substrate 10 is a p-type substrate having a concentration of p-type dopants. In other embodiments, the substrate 10 is a n-type substrate having a concentration of n-type dopants.

In various embodiments, the substrate 10 may have a substantially uniform composition or may include various layers. The layers may have similar or different compositions, and in some embodiments, some substrate layers have non-uniform compositions to induce device strain and thereby tune device performance. Examples of layered substrates include silicon-on-insulator (SOI) substrates. In some embodiments, a layer of the substrate 10 may include an insulator such as a semiconductor oxide, a semiconductor nitride, a semiconductor oxynitride, a semiconductor carbide, and/or other suitable insulator materials.

The target layer 12 may be a layer of any material that is to be patterned to form one or more features of an integrated circuit. Line-end extensions are formed in or by the target layer 12, as will be discussed in further detail herein. In some embodiments, the target layer 12 may be a dielectric layer, such as a dielectric layer formed of or including oxide, nitride, silicon oxide ($SiO_x$), silicon oxynitride (SiON), silicon nitride (SiN), or the like. In some embodiments, the target layer 12 may be a semiconductor layer, such as silicon (Si), gallium arsenide (GaAs), gallium nitride (GaN), silicon carbide (SiC), or any other semiconductor material. In some embodiments, the target layer 12 may be an electrically conductive layer, such as a layer of copper (Cu), or any other metal or electrically conductive material. The materials utilized for the target layer 12 may be selected as desired depending, for example, on the particular features to be formed by the target layer 12 once it is patterned. In various embodiments, the features formed by the target layer 12 may include, for example, semiconductor fins for a FinFET device, gate features, conductive traces or vias, or any other features of an integrated circuit.

The target layer 12 may be formed by any suitable process, including, for example, depositing dielectric layers, metals, or any other materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, or the like.

Figure 2:
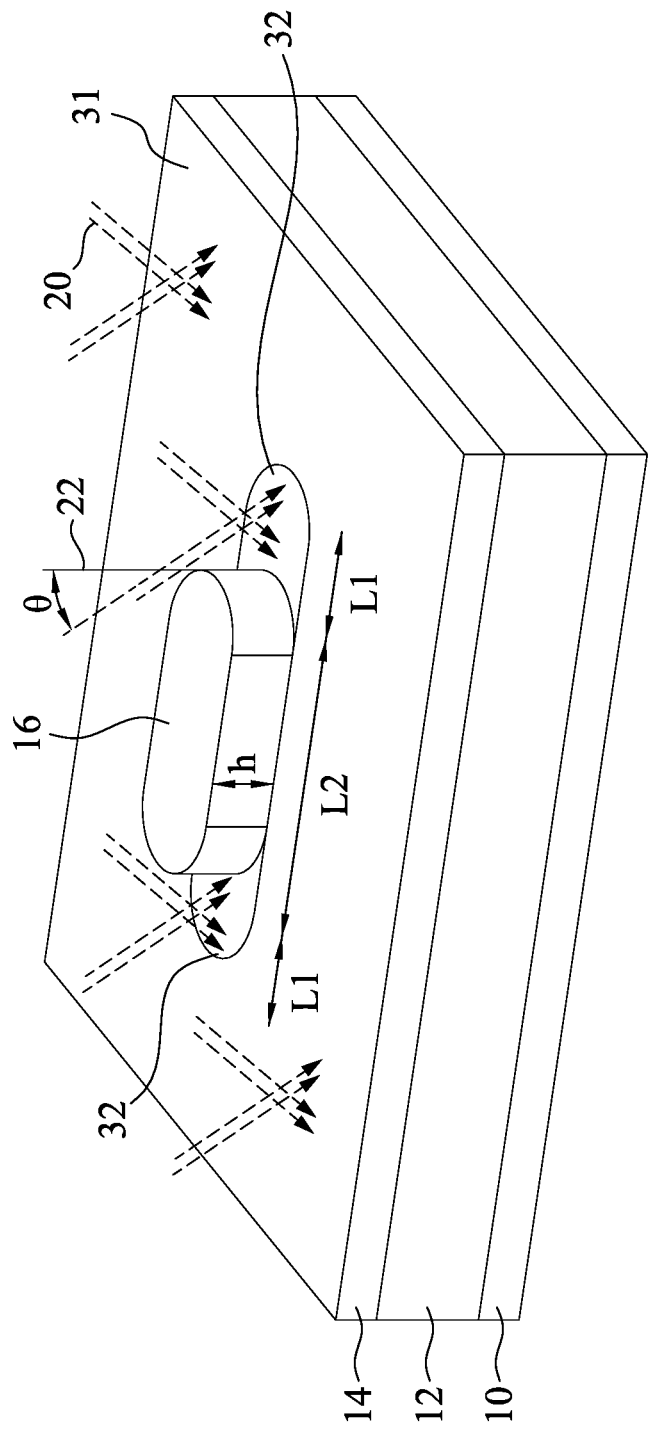

As shown in FIG. 2, a photoresist 16 is patterned on the hardmask 14, for example, using a lithographic exposure in which a photomask is used to expose selected regions of the photoresist 16 to radiation. The exposure causes a chemical reaction to occur in the exposed regions of the photoresist 16. After exposure, a developer is applied to the photoresist 16. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. In various embodiments, the patterned photoresist 16 which remains after the development process has a shape substantially corresponding of a shape of the feature to be defined in the target layer 12. However, the ends of the features to be defined in the target layer 12 (e.g., the line-ends) will be extended laterally beyond the ends of the patterned photoresist 16.

Ions 20 are implanted into the hard mask 14, as shown in FIG. 2. Implantation of the ions 20, e.g., by ion bombardment, causes a change in one or more properties of regions of the hard mask 14 into which the ions 20 are implanted. In some embodiments, the implanted ions 20 change (e.g., increase) a selective etch rate of the hard mask 14 when exposed to a suitable etchant. In some embodiments, the ions 20 include or are formed from an element chosen from the group including nitrogen (N), tellurium (Te), boron (B), gallium (Ga), phosphorus (P), arsenic (As), argon (Ar), krypton (Kr), and xenon (Xe).

The ions 20 are implanted into the hard mask 14 and may be directionally implanted, for example, by ion beams which are irradiated at selected angles with respect to the hard mask 14. In some embodiments, the ions 20 are directed toward the hard mask 14 by ion beams that are non-orthogonal with respect to the hard mask 14. For example, in some embodiments, the ions 20 are irradiated toward the hard mask 14 at an ion beam angle θ with respect to a direction 22 that is orthogonal to the hard mask 14. In the example shown in FIG. 2, ion beams may be provided at the ion beam angle θ originating from two different directions (e.g., from right-to-left and from left-to-right as shown in FIG. 2).

As shown in FIG. 2, bombardment or implantation of ions 20 into the hard mask 14 forms a first region 31 of full ion bombardment, and second regions 32 of partial ion bombardment. The second regions 32 of the hard mask 14 are only partially bombarded by the ions 20, since the photoresist 16 blocks at least some of the directional ion beams from reaching the second regions 32 of the hard mask 14. That is, the second regions 32 may be shadow regions or regions of the hard mask 14 which are shielded from receiving all of the directional ion beams due to the presence of the photoresist 16. In some embodiments, the first region 31 of the hard mask 14 may be completely unprotected or otherwise shielded from receiving the ion beams, and thus the first region 31 may be referred to as receiving 100% bombardment of the ions 20. The second regions 32 may receive any partial bombardment of the ions 20, such as 90% or less, 75% or less, 50% or less, or 25% or less of the bombardment of the ions 20. The amount or percentage of bombardment of the ions 20 received at the second regions 32 should be less than the amount or percentage of bombardments of the ions 20 received at the first region 31, so that one or more properties of the first region 31 are changed with respect to the second regions 32, which as will be discussed later herein, may include a change in the selectivity to an etchant. For example, by receiving less than full bombardment (such as less than 90%, less than 75%, less than 50%, or less than 25%), the second regions 32 may be less readily removed by an etchant than the first region 31 which receives 100% bombardment of the ions 20. Other factors may impact the change in selectivity to an etchant based on a reduced or partial bombardment of ions 20, including, for example, the material of the hard mask 14, the ion species, the etchant used, and the like. In some embodiments, receiving partial bombardment of the ions 20, such as 90% or less, 75% or less, 50% or less, or 25% or less, facilitates an appreciable difference in properties between the second regions 32 and the first region 31 (which receives 100% bombardment) so that the first region 31 may be readily removed (e.g., by an etchant) while the second regions 32 are at least partially retained.

In some embodiments, as shown in FIG. 2, the second regions 32 may be referred to as receiving 50% bombardment of the ions 20, as each of the second regions 32 receives ions 20 from only one ion beam of a particular direction (e.g., from right-to-left and from left-to-right as shown in FIG. 2), while ions 20 from the other ion beam is blocked by the photoresist 16. The second regions 32 may be referred to herein as line-end extension regions 32, as these regions will be effective extend the line-ends of the features formed in the target layer 12, as will be described in further detail later herein.

The line-end extension regions 32 may have a length L1 (e.g., in the horizontal direction as shown in FIG. 2) that is dependent on the ion beam angle θ and the height h of the photoresist 16. In some embodiments, the length L1 of the line-end extension regions 32 may be provided by the following equation:

$$L1 = h \times \tan \theta$$

Accordingly, the line-end extension regions 32 may be formed to have any desirable length L1, for example, by selectively forming the height h of the photoresist 16 at a height suitable to form the desired length L1 of the line-end extension regions 32 and/or by selectively irradiating the hard mask 14 with ion beams having a particular ion beam angle θ suitable to form the desired length L1 of the line-end extension regions 32. A region underlying the photoresist 16 may have a length L2 of any desired length, depending upon a desired feature length of a patterned feature to be formed according to the method illustrated herein. The total length of the patterned feature to be formed may be equal to the length L2 plus two times the length L1 of the line-end extension regions 32.

In some embodiments, the photoresist 16 has a thickness or height h that is less than 100 nm. In some embodiments, the photoresist 16 has a height h that is less than 75 nm. In some embodiments, the photoresist 16 has a height h that is within a range from about 20 nm to about 50 nm.

In some embodiments, the hard mask 14 has a thickness that is less than 100 nm. In some embodiments, the hard mask 14 has a thickness that is less than 50 nm. In some embodiments, the hard mask 14 has a thickness that is within a range from about 10 nm to about 20 nm.

In some embodiments, the target layer 12 has a thickness that is less than 100 nm. In some embodiments, the target layer 12 has a thickness that is less than 50 nm. In some embodiments, the target layer 12 has a thickness that is within a range from about 20 nm to about 35 nm.

In some embodiments, the ion beam angle θ is less than about 85°. In some embodiments, the ion beam angle θ is less than 80°. In some embodiments, the ion beam angle θ is greater than 30°. In some embodiments, the ion beam angle θ is within a range from about 30° to about 85°. In some embodiments, the ion beam angle θ is within a range from about 50° to about 80°. As discussed above, the length L1 of the line-end extension regions 32 depends at least in part on the height h of the photoresist 16 and the ion beam angle θ. By irradiating the ions 20 at an ion beam angle θ is within a range from about 30° to about 85°, the line-end extension regions 32 may be formed to have a suitable length L1 and the ions 20 may be effectively implanted into the hard mask 14. Outside of the ranges described herein, the ions 20 may not be effectively implanted into the hard mask 14 which may result in an insufficient change of the one or more properties of the first region 31 of the hard mask 14. For example, by irradiating the ions 20 at an ion beam angle θ that is less than about 30°, the first region 31 may not receive implanted ions 20 suitable to alter the selectivity of the first region 31 to an etchant. On the other hand, by irradiating the ions 20 at an ion beam angle θ that is greater than about 85°, the length L1 of the line-end extension regions 32 may be limited, as the photoresist 16 would need a height h that is relatively high in order to provide a desired length L1 of the line-end extension regions 32.

The implantation of ions 20 into the hard mask 14 changes one or more physical properties of the hard mask 14. In some embodiments, the implantation of ions 20 into the first region 31 of the hard mask 14 reduces the resistance to etching of the first region 31 so the first region 31 of the hard mask 14 may be more readily removed by an etching process than portions of the hard mask 14 which are not irradiated with ions 20 or which receive a lesser percentage of bombardment of ions 20. That is, the first region 31 may be more readily removed by etching than the second regions or line-end extension regions 32.

In some embodiments, the ions 20 are implanted with suitable energy so that the ions 20 penetrate at least halfway into the hard mask 14. In some embodiments, the ions 20 are implanted with an energy of 25 keV to 250 keV. In some embodiments, the ions 20 are implanted in the first region 31 with a concentration of about $10^{12}$ to $10^{15}$ ions/cm$^2$, while the ions 20 are implanted in the line-end extension regions 32 with a concentration that is less than the concentration of ions 20 implanted in the first region 31. In some embodiments, the ions 20 are implanted in the line-end extension regions 32 with a concentration that is less than 25% than the concentration of ions 20 that are implanted in the first region 31. In some embodiments, the ions 20 are implanted in the line-end extension regions 32 with a concentration that is less than 50% than the concentration of ions 20 that are implanted in the first region 31. In some embodiments, the ions 20 are implanted in the line-end extension regions 32 with a concentration that is less than 75% than the concentration of ions 20 that are implanted in the first region 31. The concentration of ions 20 implanted in the first region 31 and in the line-end extension regions 32 may be selected depending on various factors, including, for example, a desired change in property (e.g., etchant rate) of the hard mask layer 14 at the line-end extension regions 32 as compared to the first region 31.

A ratio r1/r2 of the etching rates at which the first region 31 and the second regions or line-end extension regions 32 of the hard mask 14, respectively, are etched may be selected as desired, for example, depending on design considerations. In some embodiments, the ratio of etching rates may be dependent at least in part on various factors, such as the species of the ions 20, the duration of ion bombardment, the concentration of the ions 20 during ion bombardment, the etchant used, or various other factors. In some embodiments, the ratio of etching rates r1/r2 may be greater than 1.5, greater than 2.0, greater than 3.0, or greater than 5.0.

Figure 3:
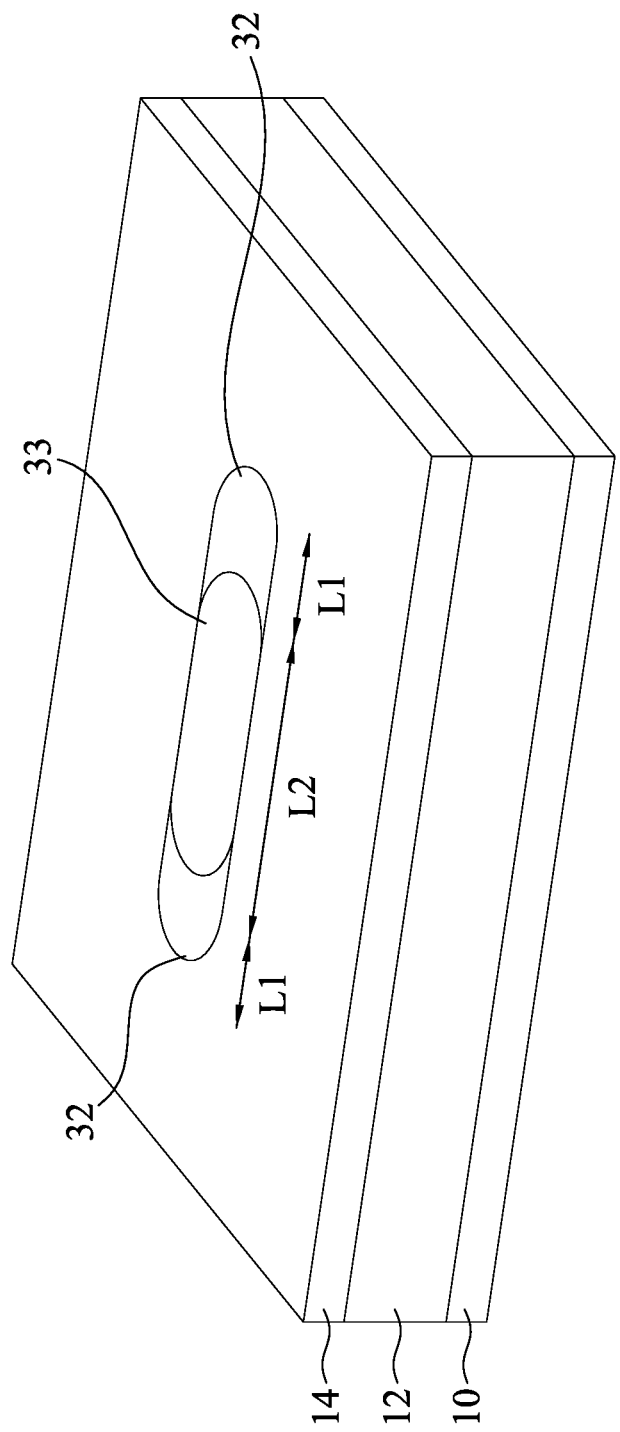

As shown in FIG. 3, the photoresist 16 is removed subsequent to the ion bombardment of the hard mask 14. The photoresist 16 may be removed by any suitable technique. In some embodiments, the photoresist 16 is removed by a wet etching process. The photoresist 16 may be removed, in some embodiments, by any photoresist stripping technique utilizing any organic stripping, inorganic stripping, or dry stripping chemicals to remove the photoresist 16.

Once the photoresist 16 has been removed, a non-bombarded region 33 of the hard mask 14 is exposed. The non-bombarded region 33 is a region underlying the position at which the photoresist 16 was present, and the photoresist 16 blocked the ions 20 from reaching the non-bombarded region 33. Thus, the non-bombarded region 33 may have a greater resistivity to etching than the first region 31 of the hard mask 14. In some embodiments, the non-bombarded region 33 may have a greater resistivity to etching than the line-end extension regions 32 of the hard mask 14.

Figure 4:
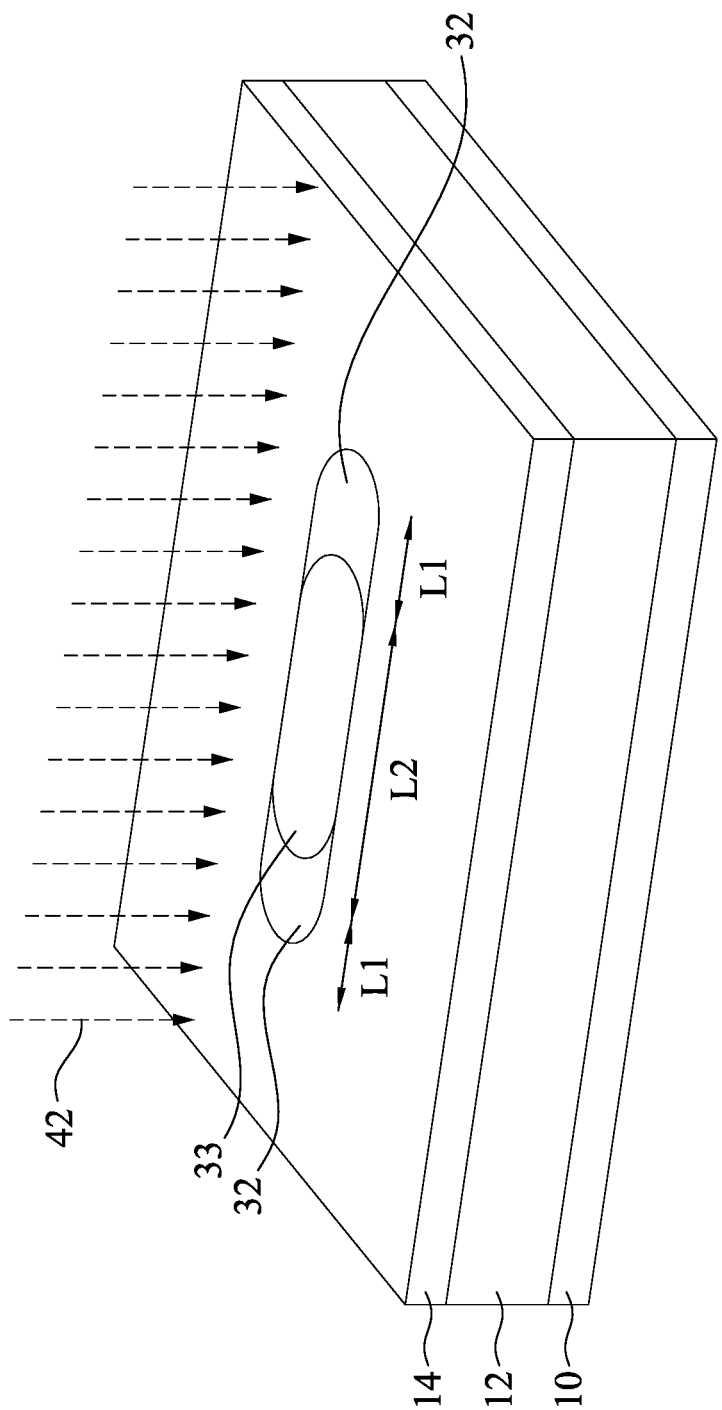

As shown in FIG. 4, the first region 31 of the hard mask 14 is removed. The first region 31 of the hard mask 14 may be removed by any suitable technique, including, for example, by wet etching, dry etching, Reactive Ion Etching (RIE), ashing, or any other suitable etching methods. In some embodiments, the first region 31 of the hard mask 14 is removed by a first etchant gas 42 having an etchant chemistry with a high selectivity to the first region 31. For example, an etchant gas may be utilized which removes the first region 31 at a higher etching rate than it removes the line-end extension regions 32 and the non-bombarded region 33 of the hard mask 14. In some embodiments, the first region 31 of the hard mask 14 is removed by an etchant gas including carbon tetrafluoride ($CF_4$), difluoromethane ($CH_2F_2$), trifluoromethane ($CHF_3$), other suitable etchants, or combinations thereof.

Figure 5:
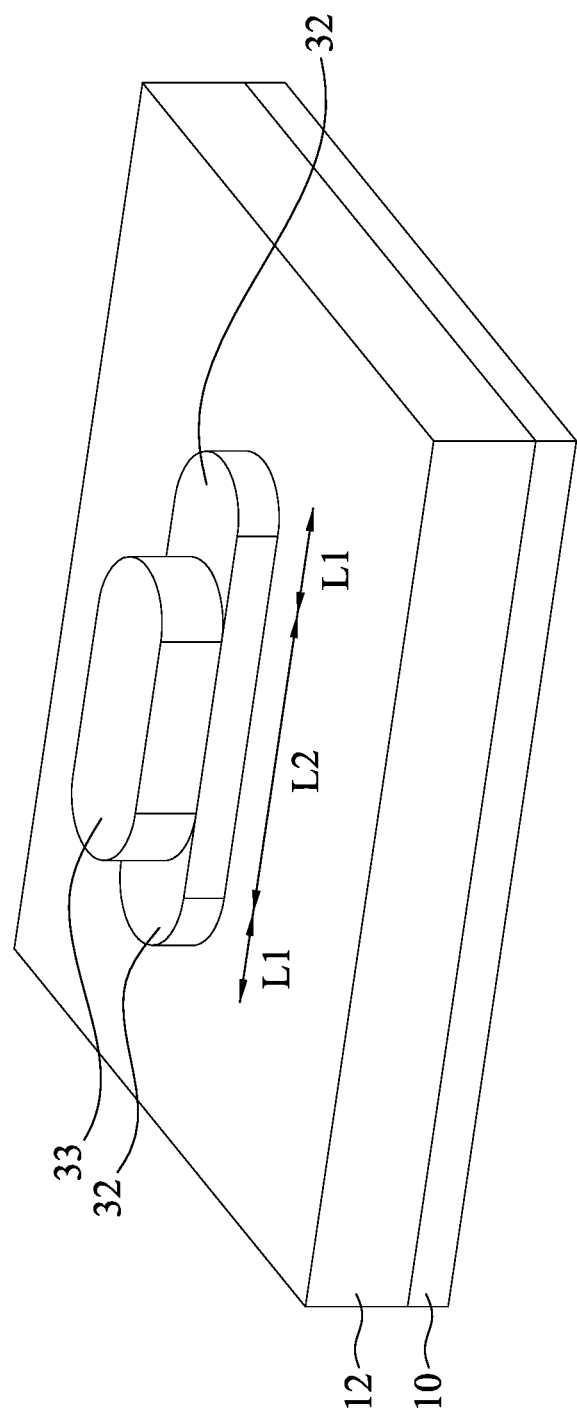

As shown in FIG. 5, portions of the target layer 12 are exposed where the first region 31 of the hard mask 14 has been removed. Remaining on the target layer 12 are the portions of the hard mask 14 that make up the line-end extension regions 32 and the non-bombarded region 33. During the removal of the first region 31 of the hard mask 14, a thickness of the line-end extension regions 32 may be reduced. For example, an etchant gas utilized to remove the first region 31 of the hard mask 14 may also remove portions of the line-end extension regions 32, thereby reducing the thickness or height of the line-end extension regions 32. However, as previously discussed herein, the line-end extension regions 32 are etched at a lower rate than the first region 31 of the hard mask 14, since the line-end extension regions 32 received a lower percentage or proportion of ions 20 during the ion bombardment (see FIG. 2). Accordingly, the line-end extension regions 32 are etched at a slower or lower rate than the first region 31. Thus, the thickness of the line-end extension regions 32 may be reduced during the etching; however, the surface area of the line-end extension regions 32 may remain substantially the same.

The non-bombarded region 33 may retain substantially the same dimensions after the removal of the hard mask 14 as before. For example, since the non-bombarded region 33 was protected from the bombardment of ions 20, the etching rate of the non-bombarded region 33 of the hard mask 14 was not reduced. Accordingly, the use of an etchant to remove the first region 31 of the hard mask 14 does not substantially affect the non-bombarded region 33. However, it will be appreciated that in various embodiments, the removal of the first region 31 of the hard mask 14 by, for example, an etchant gas may cause some reduction of the thickness of the non-bombarded region 33.

Figure 6:
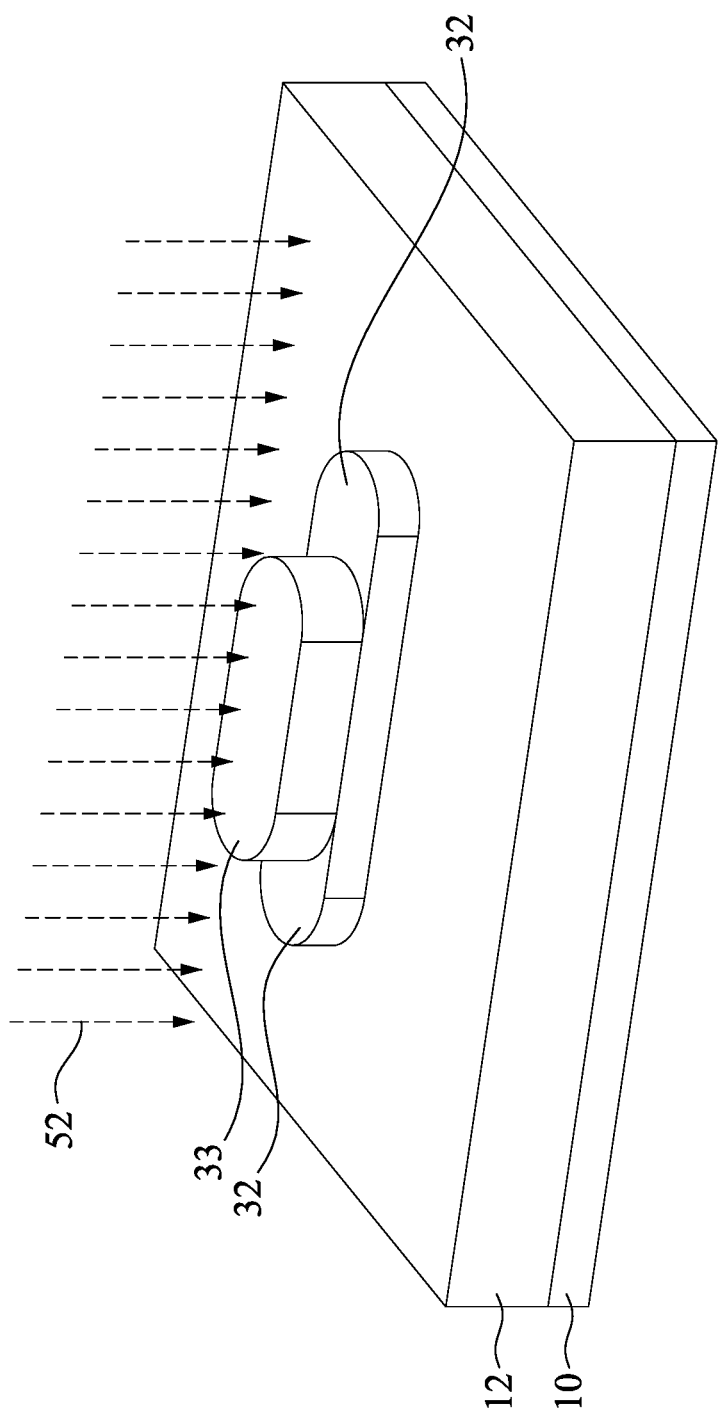

As shown in FIG. 6, the target layer 12 is patterned by transferring the pattern of the remaining hard mask 14 (e.g., the non-bombarded region 33 and the line-end extension regions 32) to the target layer 12. The target layer 12 is patterned, for example, by removing portions of the target layer 12 that are exposed or otherwise are not covered by the non-bombarded region 33 or the line-end extension regions 32 of the hard mask 14. The exposed portions of the target layer 12 may be removed by any suitable technique, including, for example, by wet etching, dry etching, RIE, ashing, or any other suitable etching methods. In some embodiments, the exposed portions of the target layer 12 are removed by a second etchant gas 52 having an etchant chemistry with a high selectivity to the target region 12. The second etchant gas 52 may be utilized, for example, to remove the exposed portions of the target region 12 while retaining the line-end extension regions 32 and the non-bombarded region 33 of the hard mask 14. In some embodiments, the second etchant gas 52 is different from the first etchant gas 42 which may be used to remove the first region 31 of the hard mask 14 (see FIG. 4). The second etchant gas 52 may be selected as desired, depending, for example, on design considerations. In some embodiments, the second etchant gas 52 may be selected depending on a composition of the target layer 12. For example, a different etchant gas may be used to remove a target layer formed of a dielectric material than is used to remove a target layer formed of an electrically conductive material.

Figure 7:
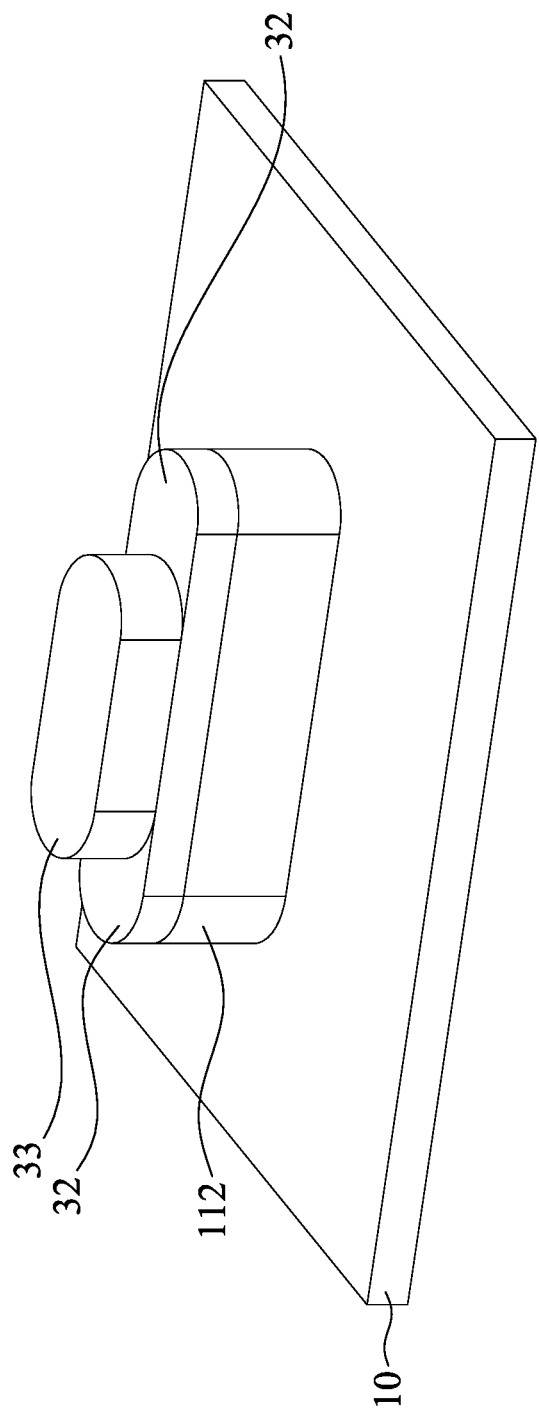

As shown in FIG. 7, a patterned feature 112 is formed from the patterning of the target layer 12. The patterned feature 112 remains on the substrate 10 after the exposed portions of the target layer 12 are removed, for example, as shown and described with respect to FIG. 6. The patterned feature 112 has a substantially same dimension as the non-bombarded region 33 and the line-end extension regions 32. For example, the patterned feature 112 may have a substantially same length and width as the non-bombarded region 33 and the line-end extension regions 32.

Figure 8:
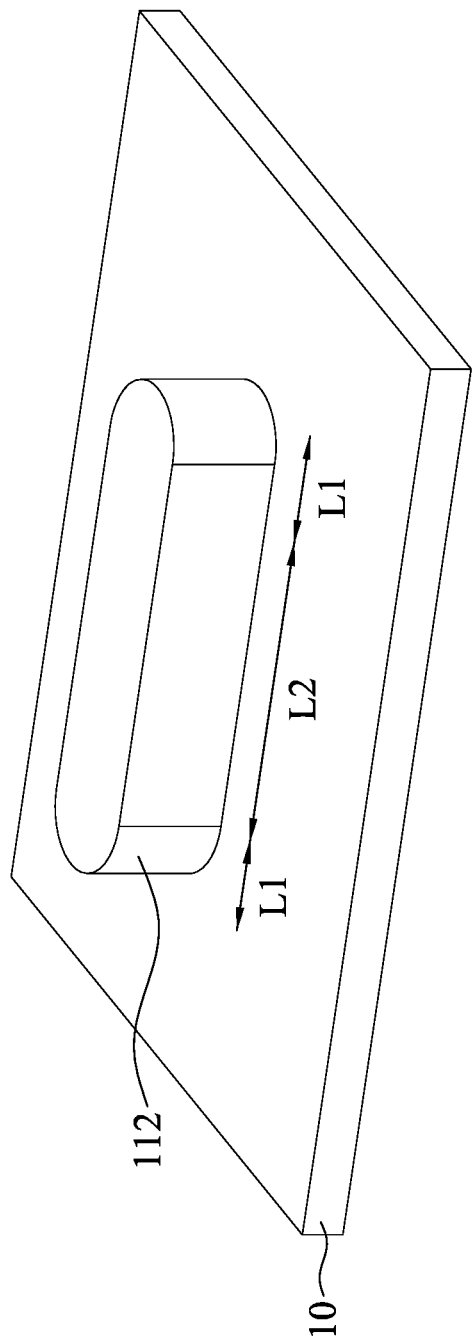

As shown in FIG. 8, the non-bombarded region 33 and the line-end extension regions 32 of the hard mask 14 may be removed. The non-bombarded region 33 and the line-end extension regions 32 of the hard mask 14 may be removed by any suitable technique, including, for example, by wet etching, dry etching, RIE, ashing, or any other suitable etching methods. In some embodiments, the non-bombarded region 33 and the line-end extension regions 32 of the hard mask 14 is removed by a third etchant gas having an etchant chemistry with a high selectivity to the hard mask 14. In some embodiments, the non-bombarded region 33 and the line-end extension regions 32 of the hard mask 14 are removed by an etchant gas including carbon tetrafluoride ($CF_4$), difluoromethane ($CH_2F_2$), trifluoromethane ($CHF_3$), other suitable etchants, or combinations thereof. In some embodiments, the third etchant gas is the same as the first etchant gas 42.

The patterned feature 112 may be any feature of an integrated circuit, including any electrically conductive feature or semiconductor feature. In some embodiments, the patterned feature 112 may be a semiconductor fin of a FinFET device, a gate feature such as a polysilicon or metal gate, an electrically conductive trace or via, or any other feature of an integrated circuit.

The patterned feature 112 may be formed to have any desired shape. For example, while the patterned feature 112 is shown as a linear shape having a length along one direction, it will be readily appreciated that other shapes may be formed in various embodiments using the methods described herein. For example, the photoresist may be patterned to have any desired shape utilizing photolithographic techniques described herein, and the hard mask layer may be subjected to ion implantation as described herein to form line-end extensions at line-ends of the photoresist having any desired shape.

In some embodiments, multiple patterned features 112 may be formed in close proximity to one another. The line-end extensions formed by ion implantation as described herein facilitates a reduction in the gaps between adjacent or facing line-ends of features of an integrated circuit.

Figure 9:
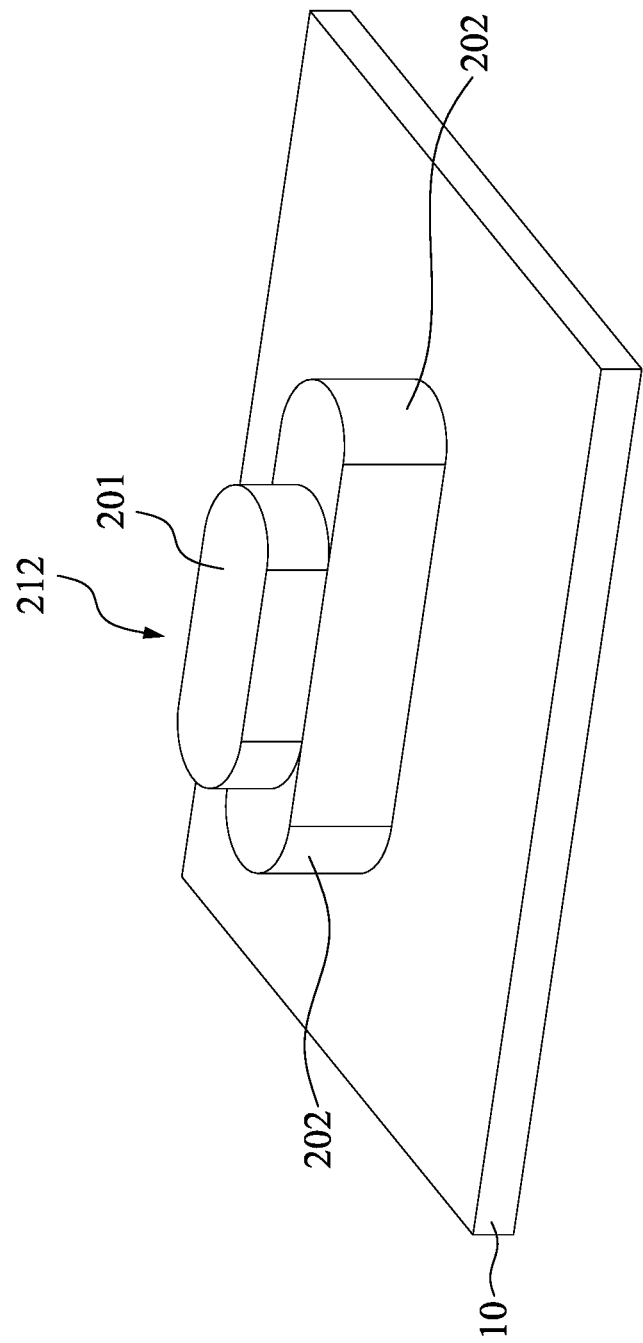
FIG. 9 is a cross-sectional diagram illustrating a patterned feature formed by a modification of the method described with respect to FIGS. 1 through 8, in accordance with some embodiments.

FIG. 9 is a cross-sectional diagram illustrating a patterned feature 212 in accordance with some embodiments of the present disclosure. The patterned feature 212 may be formed by substantially the same method as illustrated in FIGS. 1 through 8, however with some modifications. The patterned feature 212 may be formed by performing the method illustrated in FIGS. 1 through 7, with a modification with respect to FIG. 8.

In particular, as shown in FIG. 9, the non-bombarded region 33 and the line-end extension regions 32 of the hard mask 14 may be removed by an etchant gas that is different from the third etchant gas described with respect to FIG. 8. For example, rather than using the third etchant gas having an etchant chemistry with a high selectivity to the hard mask 14, in embodiments illustrated in FIG. 9, the non-bombarded region 33 and the line-end extension regions 32 of the hard mask 14 may be removed by a fourth etchant gas having low or marginal selectivity between the hard mask 14 and the material of the target layer 12.

As the fourth etchant gas has a low or marginal selectivity between the hard mask 14 and the material of the target layer 12, the fourth etchant gas may remove respective portions of the hard mask 14 and the target layer 12 at a similar or substantially same rate. Therefore, the thinner portions of the hard mask 14 (e.g., the line-end extension regions 32) may be fully removed by the etchant gas before the thicker portions of the hard mask 14 (e.g., the non-bombarded region 33) is fully removed. The removal of the line-end extension regions 33 prior to complete removal of the non-bombarded regions 33 thus exposes portions of the target layer 12 in the regions where the line-end extension regions 33 are first removed. Accordingly, the resultant shape of the patterned feature 212 may resemble the shape of the hard mask 14 as shown, for example, at FIG. 7. For example, the patterned feature 212 may have a first portion 201 that is thicker than second portions 202 which extend laterally outward from the first portion 201. The first portion 201 of the patterned feature 212 may be referred to as a "nature line-end" as the first portion 201 has dimensions (e.g., a length and width) corresponding to dimensions of the photoresist 16 (see FIG. 2) and the non-bombarded region 33 of the hard mask 14. The second portions 202 of the patterned feature 212 may be referred to as "extended line-end" portions as the second portions 202 have dimensions corresponding to the line-end extension regions 33 of the hard mask 14.

Figure 10:
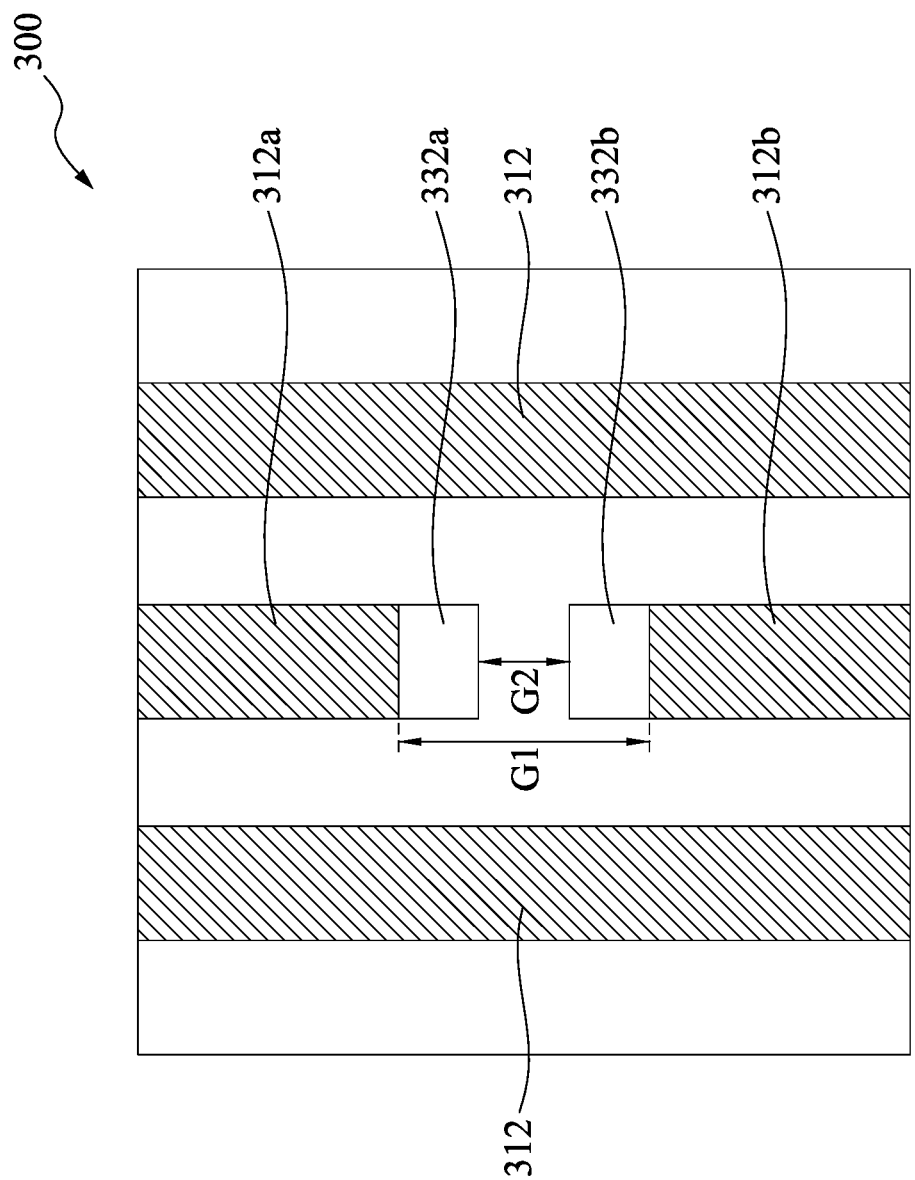
FIG. 10 is a plan view diagram illustrating a device, in accordance with some embodiments.

FIG. 10 is a plan view diagram illustrating a device 300, which may be manufactured in accordance with the method illustrated herein, for example, with reference to FIGS. 1 through 9. The device 300 may be an electronic device, for example, an integrated circuit or the like.

The device 300 includes a plurality of patterned features 312 formed on a substrate 310. The patterned features 312 may be formed according to the methods described herein, for example, as described with respect to FIGS. 1 through 9. In various embodiments, the patterned features 312 may include, for example, semiconductor device features, such as fins for a FinFET device, gate features, conductive traces or vias, or any other features of an integrated circuit.

At least some of the patterned features 312 may include nature line end portions 312a, 312b and line-end extension portions 332a, 332b. The line-end extension portions 332a, 332b may be formed, for example, by ion bombardment as described previously herein. The nature line end portions 312a, 312b represent portions of the patterned features 312 that are blocked by the ion bombardment, for example, as described previously herein with regard to the non-bombarded regions 33. Utilizing processes described herein, such as ion bombardment, the line-end extension portions 332a, 332b may be formed in a way that facilitates a reduction of an end-to-end gap between the patterned features 312.

In some embodiments, the plurality of patterned features 312 may be formed based on a layout that includes a layout of shapes. The layout may be, for example, a data file stored on a non-transitory computer-readable medium and represented in a design standard such as GDSII, OASIS, or the like. The layout may be a digital representation of the device 300, which may be an integrated circuit. The shapes of the layout may correspond to and define physical features of the device 300. More particularly, the shapes of the layout may define physical features, such as portions of the patterned features 312 of the device 300. However, the layout may be constrained by dimensional limitations of photolithographic processes for manufacturing an integrated circuit based on the layout. For example, gaps (or line end to end distances) between the shapes of the layout may be constrained by dimensions of a photomask that can be physically produced based on the layout. More particularly, a nature line end-to-end gap G1 between facing shapes of the layout may be confined by photolithographic processes, such as dimensional limitations of the photomask that can be produced to form the shapes.

In some embodiments, a photomask is formed based on the shapes of the layout. As described, for example, with respect to FIGS. 1 and 2, a hard mask layer is formed on a target layer, and the photomask may be used to pattern a photoresist formed over the hard mask layer. The patterned photoresist may correspond with the patterned features 312 and the patterned features 312a and 312b shown in FIG. 10, and a minimum distance between the patterned photoresist (e.g., for forming the features 312a and 312b) may be the nature line end-to-end gap G1. Line-end extension regions 332a, 332b of the patterned features 312a, 312b may be uncovered by the photoresist, and the line-end extension regions 332a, 332b may be formed as previously described herein, e.g., by ion bombardment to form line-end extension regions in the hard mask, and subsequently patterning a target layer to form the patterned features 312 including the line-end extension regions 332a, 332b.

Utilizing processes described herein, such as ion bombardment to form line-end extension regions, the line-end extension portions 332a, 332b of the patterned features 312 may be formed with a reduced line end-to-end gap G2 between the patterned features 312, as compared to the nature line end-to-end gap G1 which is limited by limitations of traditional photolithographic processes.

In some embodiments, the line end-to-end gap G2 may be less than 25 nm. In some embodiments, the line end-to-end gap G2 may be less than 18 nm. In some embodiments, the line end-to-end gap G2 may be less than 14 nm. In some embodiments, the line end-to-end gap G2 may be less than 10 nm. In some embodiments, the line end-to-end gap G2 may be within a range from about 5 nm to about 25 nm. By forming the line end-to-end gap G2 within this range, the line ends of patterned features 312 may be formed very close to one another, thereby increasing a number of such features 312 that may be formed within a given area, while having a sufficient gap or distance between the features 312 to electrically isolate the features 312 from one another and prevent or reduce undesirable cross coupling of the features 312.

The dimensions of the line end-to-end gap G2 is not limited by any particular dimensional limitations of photolithographic or cut processes, but instead, the gap G2 may be formed having a significantly reduced distance that is limited by the height h of the photoresist and the ion beam angle θ (as described, for example, with respect to FIG. 2), each of which may be selected as desired to provide a desired length of the line-end extension regions, as well as a desired gap G2 between the patterned features 312.

As previously discussed, the patterned features 312 may be any features of an integrated circuit, including, for example, semiconductor device features, such as fins for a FinFET device, gate features, conductive traces or vias, or any other features of an integrated circuit.

It will be readily appreciated the device 300 shown in FIG. 10 may be a portion or region of an integrated circuit, and in some embodiments, the device 300 may include a variety of additional features, including, for example, additional patterned features 312, as well as any other features of an integrated circuit.

The present disclosure provides, in various embodiments, methods and devices in which line-end extensions of patterned features are formed at the ends of feature lines, thereby facilitating a reduction in the distance or gap that may be achieved between patterned features of an integrated circuit. In some embodiments, the line-end extensions may be formed without additional cut layers (and corresponding additional mask processes), which otherwise may be relied on to form line-end extensions in other techniques. This provides a significant advantage in terms of increasing density of features which may be formed in an integrated circuit.

According to one embodiment, a method includes forming a patterned photoresist on a first region of a hard mask layer. A line-end extension region is formed in the hard mask layer. The line-end extension region extends laterally outward from an end of the first region of the hard mask layer. The line-end extension region may be formed by changing a physical property of the hard mask layer at the line-end extension region.

According to another embodiment, a method is provided that includes forming a hard mask layer on a target layer. The target layer is disposed between a substrate and the hard mask layer. A patterned photoresist is formed on a plurality of first regions of the hard mask layer. A plurality of line-end extension regions is formed extending outwardly from ends of the plurality of first regions by irradiating the hard mask layer with a plurality of ion beams. Each of the ion beams have a non-zero ion beam angle with respect to a direction orthogonal to the hard mask layer, and the patterned photoresist blocks at least a portion of the plurality of ion beams from reaching the plurality of line-end extension regions. The patterned photoresist is removed. Portions of the target layer are exposed by removing portions of the hard mask layer outside of the plurality of first regions and the plurality of line-end extension regions. A patterned feature is formed in the target layer by removing the exposed portions of the target layer.

According to yet another embodiment, an integrated circuit includes a substrate and a plurality of patterned features on the substrate. Each of the patterned features is formed of a same material. A distance between an end of a first patterned feature of the plurality of features and an end of a second patterned feature of the plurality of patterned features is less than 25 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a substrate; and
   a plurality of patterned features on the substrate, each of the plurality of patterned features formed of a same material,
   wherein a distance between an end of a first patterned feature of the plurality of features and an end of a second patterned feature of the plurality of patterned features is less than 25 nm, and
   wherein each of the plurality of patterned features include a first portion that was under a portion of a hard mask that was shadowed from ion bombardment during a hard mask patterning step and a second portion that was under a portion of the hardmask that was partially shadowed from the ion bombardment during the hard mask patterning step.

2. The integrated circuit of claim 1, wherein the distance between the end of the first patterned feature and the end of the second patterned feature is less than 10 nm.

3. The integrated circuit of claim 1, wherein the plurality of patterned features includes at least one of: a semiconductor device feature, a polysilicon or metal gate, an electrically conductive trace, or an electrically conductive via.

4. The integrated circuit of claim 1, wherein the same material is silicon oxide, silicon oxynitride, silicon nitride, silicon, gallium arsenide, gallium nitride, silicon carbide or an electrically conductive material.

5. The integrated circuit of claim 1, wherein the first portion of each of the plurality of features includes a nature line-end and the second portion of each of the plurality of features includes an extended line end.

6. The integrated circuit of claim 5, wherein the extended line end extends laterally outward from the nature line-end.

7. The integrated circuit of claim 6, wherein the nature line-end is thicker than the extended line end.

8. A semiconductor feature comprising:
   a substrate; and
   a plurality of patterned features on the substrate, each of the plurality of patterned features formed of a same material,
   wherein each of the plurality of patterned features include a nature line-end and an extended line end, and
   wherein the nature line-end was under a portion of a hard mask that was shadowed from ion bombardment during a hard mask patterning step and the extended line end was under a portion of the hardmask that was partially shadowed from the ion bombardment during the hard mask patterning step.

9. The semiconductor feature of claim 8, wherein a distance between an end of the extended line end of one of the plurality of patterned features and an end of the extended line end of another of the plurality of patterned features is less than 25 nm.

10. The semiconductor feature of claim 9, wherein the distance between the end of the first patterned feature and the end of the second patterned feature is less than 10 nm.

11. The semiconductor feature of claim 8, wherein the nature line-end is thicker than the extended line end.

12. The semiconductor feature of claim 8, wherein the extended line end extends laterally outward from the nature line-end.

13. The semiconductor feature of claim 8, wherein the same material is silicon oxide, silicon oxynitride, silicon nitride, silicon, gallium arsenide, gallium nitride, silicon carbide or an electrically conductive material.

14. The semiconductor feature of claim 8, wherein the plurality of patterned features includes at least one of: a semiconductor device feature, a polysilicon or metal gate, an electrically conductive trace, or an electrically conductive via.

15. A semiconductor feature comprising:
   a substrate; and
   a plurality of patterned features on the substrate, each of the plurality of patterned features formed of a same material,
   wherein each of the plurality of patterned features include a first portion that was under a portion of a hard mask that was shadowed from ion bombardment during a hard mask patterning step and a second portion that was under a portion of the hardmask that was partially shadowed from the ion bombardment during the hard mask patterning step.

16. The semiconductor feature of claim 15, wherein the first portion is thicker than the second portion.

17. The semiconductor feature of claim 15, wherein the second portion extends laterally outward from the first portion.

18. The semiconductor feature of claim 15, wherein the same material is silicon oxide, silicon oxynitride, silicon nitride, silicon, gallium arsenide, gallium nitride, silicon carbide or an electrically conductive material.

19. The semiconductor feature of claim 15, wherein the plurality of patterned features includes at least one of: a semiconductor device feature, a polysilicon or metal gate, an electrically conductive trace, or an electrically conductive via.

20. The semiconductor feature of claim 15, wherein ions of the ion bombardment are selected from the group of ions including nitrogen, tellurium, boron, gallium, phosphorus, arsenic, argon, krypton and xenon ions.

* * * * *